(12) United States Patent
Wortberg et al.

(10) Patent No.: US 9,744,865 B2
(45) Date of Patent: Aug. 29, 2017

(54) LINE FOR SUPPLYING ELECTRICAL UNITS WITH POWER IN VEHICLES

(71) Applicant: Lisa Draexlmaier GmbH, Vilsbiburg (DE)

(72) Inventors: Michael Wortberg, Dorfen (DE); Alfred Grom, Munich (DE); Konrad Hanakam, Munich (DE); Josef Schandl, Marklkofen-Warth (DE); Klaus Specht, Geisenhausen (DE); Harald Sommavilla, Sankt Peter am Hart (AT)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 15/215,898

(22) Filed: Jul. 21, 2016

(65) Prior Publication Data

US 2017/0021784 A1    Jan. 26, 2017

(30) Foreign Application Priority Data

Jul. 22, 2015  (DE) .......................... 10 2015 111 882

(51) Int. Cl.
*H02G 5/00* (2006.01)
*B60L 11/18* (2006.01)
*H01B 7/00* (2006.01)

(52) U.S. Cl.
CPC ............ *B60L 11/18* (2013.01); *H01B 7/0018* (2013.01)

(58) Field of Classification Search
CPC ........ H01R 9/2675; H02B 1/202; H02G 5/02; H02G 5/025; H02G 5/00; B60L 9/005; B60L 1/04; B60L 1/00
See application file for complete search history.

(56) References Cited

U.S. PATENT DOCUMENTS

| | | | | |
|---|---|---|---|---|
| 3,601,525 A | * | 8/1971 | Oravec ................. | H01B 17/16 126/242 |
| 4,820,902 A | * | 4/1989 | Gillery .............. | B32B 17/10036 219/203 |
| 5,552,976 A | * | 9/1996 | Munro ................... | B60L 9/005 363/132 |
| 2011/0180336 A1 | | 7/2011 | Kurata | |

FOREIGN PATENT DOCUMENTS

| | | |
|---|---|---|
| DE | 10 2005 015 945 A1 | 10/2006 |
| DE | 11 2009 002 491 T5 | 1/2012 |
| DE | 10 2011 004 355 A1 | 8/2012 |

\* cited by examiner

*Primary Examiner* — Rexford Barnie
*Assistant Examiner* — Terrence Willoughby
(74) *Attorney, Agent, or Firm* — Finnegan, Henderson, Farabow, Garrett & Dunner LLP

(57) ABSTRACT

A line for supplying electrical units with power of more than 3 kW in vehicles, comprising: at least two electrically conducting, oblong bus bars having a flat cross-section and two opposite ends in the longitudinal direction, the bus bars each being insulated from and extending parallel to each other; a foil shield surrounding the bus bars from a first of the ends to a second of the ends; a stranded drain wire running between the bus bars and the foil shield in the longitudinal direction from the first end to the second end; a pair of flexible electrical conductors at one of the ends of the bus bars, each surrounded by a shield and electrically connected at a first end to a respective one of the bus bars, with the shield of the conductors being electrically connected in each case to the stranded drain wire.

19 Claims, 3 Drawing Sheets

LINE FOR SUPPLYING ELECTRICAL UNITS WITH POWER IN VEHICLES

CROSS REFERENCE TO RELATED APPLICATIONS

This application is based upon and claims the benefit of prior German Patent Application No. 10 2015 111 882.3, filed on Jul. 22, 2015, the entire contents of which are incorporated herein by reference.

TECHNICAL FIELD

The present disclosure relates to a line for supplying electrical units with power of more than 3 kW, and preferably more than 12 kW, in vehicles, and in particular in motor vehicles. The present disclosure further relates to a battery line for connecting a high-voltage (HV) battery to a power electronics system of the electric drive of an electric vehicle or of a hybrid vehicle. The present disclosure can also be used for 48 V electrical systems of a motor vehicle, regardless of the type of drive.

BACKGROUND

In electric vehicles, the HV battery is generally connected to the power electronics (DC link) of the electric drive via two circular conductors, which are connected to the positive and negative pole of the HV battery. The power electronics system is a clocked load (an inverter). For electromagnetic compatibility (EMC) reasons, the circular conductors are thus provided with a shield. Depending on the arrangement of the HV battery, however, the distance between the output of the battery and the terminal of the power electronics system in the vehicle may be as much as several meters, so that shielded circular conductors having large cross-sections must be used. These are not only expensive, but also require a lot of installation space. Furthermore, such circular conductors have a large field propagation, so that they can only be installed in the exterior of the vehicle, thus requiring mechanical protection of the circular conductors, which is comparatively complex.

SUMMARY

Embodiments of the present disclosure provide a line that may be installed in the exterior and/or interior, is cost-effective, requires little installation space, and meets EMC requirements.

According to embodiments of the present disclosure, a double bus bar is used instead of the two circular conductors of the prior art. For example, two parallel bus bars are used, each being insulated. The double bus bar configuration may lower field propagation in comparison to the circular conductors. In this way, equalizing currents generated by the magnetic fields of the circular conductors in the shield may be reduced, and thermal overloading of the shield connection may be avoided, Furthermore, eddy current losses caused by the high alternating magnetic fields in the auto body sheet may be reduced, and moreover disturbance injections into other cables and systems may be reduced. Finally, it may be possible to eliminate the problems generated by the alternating magnetic fields of the circular conductors for the final vehicle acceptance with respect to different national requirements. Since the field effect of the double bus bars is lower than that of the circular conductors, the line may be used in the cabin of the vehicle, so that the mechanical protection in the exterior may be eliminated.

However, when bus bars are used instead of circular conductors contacting may occur, both at the HV battery and at the power electronics. The HV terminals used on the HV battery and the power electronics, for example, may require shielded circular conductors, In addition, a certain level of flexibility of the line may be needed to absorb vibrations and for connecting the plugs at the ends of the line to the HV terminals.

According to embodiments of the present disclosure, a respective circular cross-sectioned conductor pair is connected at opposite ends of the double bus bar, wherein the circular conductor pair comprises the plug for connecting to the HV terminal of the HV battery or the power electronics. In this connection, it may be necessary to transition a shield (for example, an EMC shield) of the double bus bar to the shield of the circular conductors without creating a "leak" with respect to the EMC. A continuous shield from one end of the line to the other end of the line may also be required for what is known as "insulation monitor diagnosis."

According to embodiments of the present disclosure, a line for supplying electrical units with power of more than 3 kW, and preferably more than 12 kW, in vehicles, and in particular in motor vehicles, is provided. Examples of electrical units having a power of more than 3 kW are, for example, start-stop functions (boost and recuperation), air conditioning compressors, electrical heaters, pumps, steering drives and the like. In this connection, the line may be used in a 48 V electrical system of a vehicle. If the line is used for electrical units having a power of more than 12 kW, this is referred to as a high-voltage application. The unit can be an electric drive of an electric or hybrid vehicle. In this process, battery voltages of up to 1000 V may be used. The line comprises two electrically conducting, oblong bus bars, "Oblong" in this regard shall be understood to mean that the bus bars are longer in length than width and height, and have a longitudinal direction. Accordingly, the bus bars have two opposite ends in the longitudinal direction. The bus bars have a flat cross-section, which is to say they are wider than their height. According to an embodiment, the height of the bus bars is less than 20 mm, preferably less than 15 mm, and more preferably less than or equal to 10 mm. In one exemplary embodiment, the width of the bus bars is less than 100 mm, preferably less than 80 mm, and more preferably less than 65 mm. According to one embodiment, the width of the bus bars is 60 mm, and the height of the bus bars is 10 mm. The bus bars extend parallel to each other, wherein they are disposed on top of each other to minimize the installation space, such that the surface areas of the bus bars defined by the width and the length face each other, and they are aligned at their longitudinal edges. The bus bars are furthermore electrically insulated from each other, wherein the insulation can have a thickness of 0.3 to 2 mm, and preferably of 0.5 to 1 mm.

According to embodiments of the present disclosure, the bus bars are made of aluminum or an aluminum alloy. Since the bus bars have a lower field propagation, which also results in lower shield equalizing currents, a screen foil or a foil shield may be used as the shield for the bus bars. A foil shield also provides a screen against high frequency. A foil shield is made of a thin foil, for example, which is placed around the insulation of the bus bars and coated with an electrically conducting material, such as aluminum. The line includes a stranded drain wire, which extends between the bus bars and/or the insulation of the bus bars and the foil shield in longitudinal direction of the bus bars from the first end to the second end of the bus bars. A stranded drain wire may be a bare, non-insulated lead, which may be connected directly to ground and electrically connected to the foil shield. The stranded drain wire can extend parallel to the longitudinal direction and be in contact with the foil shield along the longitudinal direction so as to establish the electrical connection. The stranded drain wire can be made of copper or a copper alloy. Moreover, at least one pair of flexible electrical conductors is provided at one of the ends of the bus bars. In other words, a first electrical conductor and a second electrical conductor are present. The first electrical conductor is electrically connected to a first of the bus bars, and the second electrical conductor is electrically connected to a second of the bus bars. A respective connecting lug may be provided on the bus bars for this purpose, which is integrally joined (for example, welded) to the bus bar.

According to embodiments of the present disclosure, bimetal connecting lugs having a transition from copper or a copper alloy to aluminum or an aluminum alloy may be used if the bus bars are made of aluminum, while the conductors are made of copper or a copper alloy. Alternatively, the conductors may be produced from aluminum or an aluminum alloy to establish direct contact between these and the bus bars. The electrical conductors are each surrounded by a shield (for example, an EMC shield). The shield of the conductors may be joined to the stranded drain wire, whereby the foil shield of the bus bars is electrically connected to the shield of the conductors. Equalizing currents due to ground offset can be carried through the stranded drain wires. The stranded drain wire forms a simple transition or connection of the foil shield to the shield of the conductors in terms of construction. The line according to these embodiments is more cost-effective, can be installed in the interior of the vehicle, meets the requirements in regard to EMC, and allows an insulation monitor diagnosis.

According to embodiments of the present disclosure, the foil shield extends behind the shield connection and ensures that no "EMC leak" develops. In other words, the foil shield extends in the longitudinal direction beyond the ends of the conductors connected to the bus bars and overlaps with the shield of the conductors. If the connecting lugs are provided, the foil shield extends beyond the connecting lugs in the longitudinal direction.

According to embodiments of the present disclosure, two pairs of the flexible, electrical conductors may be provided at opposite ends of the bus bars. A third conductor is connected to the first bus bar, and a fourth conductor is connected to the second bus bar. The connection is carried out in the same manner as described above with respect to the first and second conductors. In this way, a plug connection (for example, a plug can be disposed at the ends of the connectors) can be ensured at both ends of the line, for example for connecting to the power electronics and the HV battery, and potentially developing vibrations can be damped by the flexible conductors at both ends.

According to embodiments of the present disclosure, the flexible conductors at one end or both ends are circular conductors, so that conventional plugs may be used for connecting to the power electronics or HV battery.

According to embodiments of the present disclosure, the flexible conductors may be electrically connected at a first of the ends thereof to the bus bars as described above, and may be electrically connected at a second of the ends thereof to a plug. The plug is suitable for connecting to a terminal of a power electronics or HV battery.

According to embodiments of the present disclosure, a stranded drain wire is electrically connected to the shield of the conductors, and is in contact with the two shields of the two electrical conductors of the pair. The contacting may be carried out directly in that the stranded drain wires make direct contact with the two shields. If conductor pairs are disposed at both ends of the bus bars, the stranded drain wire is electrically connected or contacted at opposite ends to the shields of the two conductor pairs, to connect the shields of the conductor pairs at both ends to each other.

According to embodiments of the present disclosure, if the ampacity of one stranded drain wire is not sufficient to accommodate the equalizing currents, a second stranded drain wire may be provided. If needed, it is also possible to dispose more than two stranded drain wires. In this embodiment, both stranded drain wires can be in contact with the two shields of the two conductors of the pair. Alternatively, however, it is also conceivable for one of the stranded drain wires to be in contact with the shield of the first conductor, while the other stranded drain wire is in contact with the shield of the second conductor.

According to embodiments of the present disclosure, the line may be used in systems to connect a power electronics system and a battery designed for the power needed to supply electrical power units to each other. The line is used in a vehicle having an electric drive, for example an electric vehicle or a hybrid vehicle, wherein the power electronics is connected to the electric drive, for example at the front axle and/or the rear axle.

According to embodiments of the present disclosure, a line is disclosed for supplying power to electrical units in a vehicle, comprising at least two electrically conducting, oblong bus bars, extending parallel to each other, the bus bars having a flat cross-section and two opposite ends in the longitudinal direction, wherein the bus bars are respectively insulated from each other; a foil shield surrounding the bus bars from a first of the opposite ends to a second of the opposite ends; a first stranded drain wire running between the bus bars and the foil shield in the longitudinal direction from the first of the opposite ends to the second of the opposite ends, wherein the first stranded drain wire is in electrical contact with the foil shield and is configured to carry ground offset equalizing currents; a pair of flexible electrical conductors at the first of the opposite ends of the bus bars, wherein each flexible electrical conductor includes a first end and a second end, the first conductor end being electrically connected to a respective one of the bus bars; and a shield surrounding each flexible electrical conductor, wherein each shield is electrically connected to the first stranded drain wire.

According to embodiments of the present disclosure, disadvantages described with respect to the circular conductors of the prior art are mitigated, while allowing the use of conventional plugs for connecting to the power electronics and the HV battery and achieving continuous EMC shielding.

The described properties of the present disclosure and the manner in which these are achieved will be described in more detail based on the following detailed description. The foregoing general description and the following detailed description are exemplary and explanatory only, and are not restrictive of embodiments consistent with the present disclosure. Further, the accompanying drawings illustrate embodiments of the present disclosure, and together with the description, serve to explain principles of the present disclosure.

DETAILED DESCRIPTION

Figure 1:
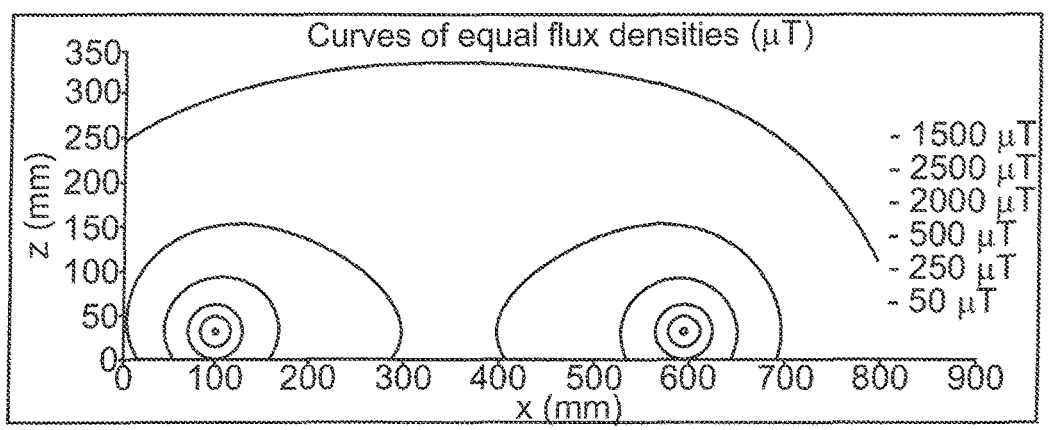
FIG. 1 shows curves having equal flux densities in a case where two prior art circular conductors having −100 A and 100 A are used.

In the various views, identical or comparable elements are denoted by the same reference numerals and a repeat description is eliminated in the different aspects.

Figure 2:
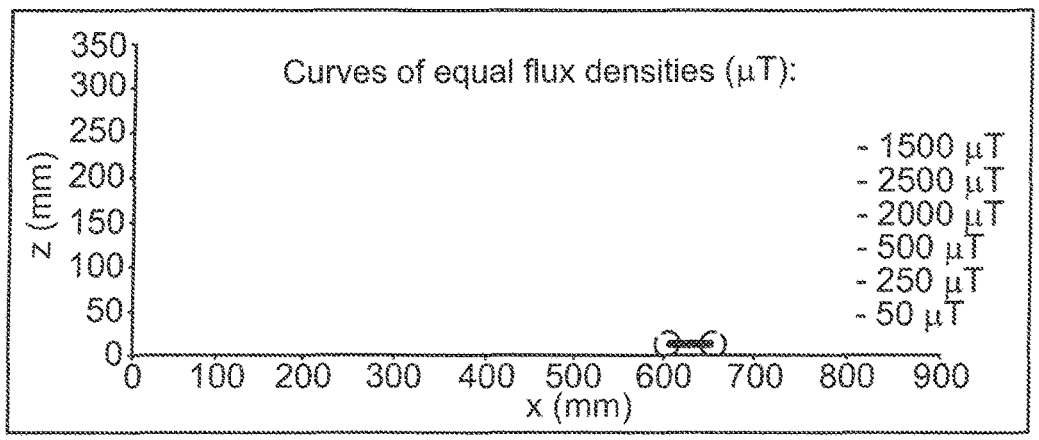
FIG. 2 shows curves having equal flux densities in a case where two bus bars having a cross-section of 60 mm×10 mm and a distance of 1 mm as well as −100 A and 100 A are used.
Figure 4:
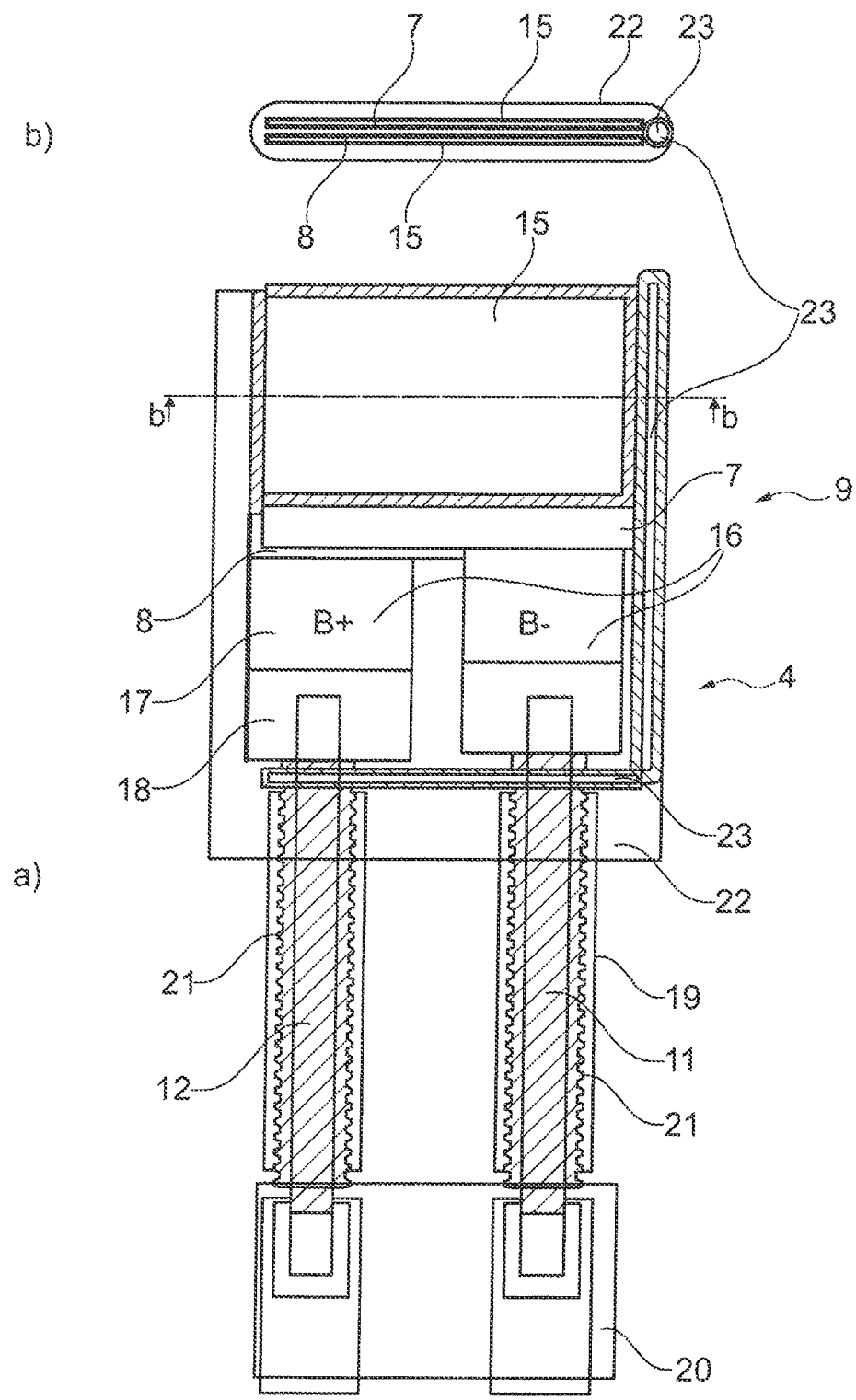
FIG. 4 schematically shows a section of an exemplary line according to a first aspect at a first end, wherein section a) shows a schematic top view onto one end of the line, and section b) shows a cross-section along the line b-b in section a)
Figure 5:
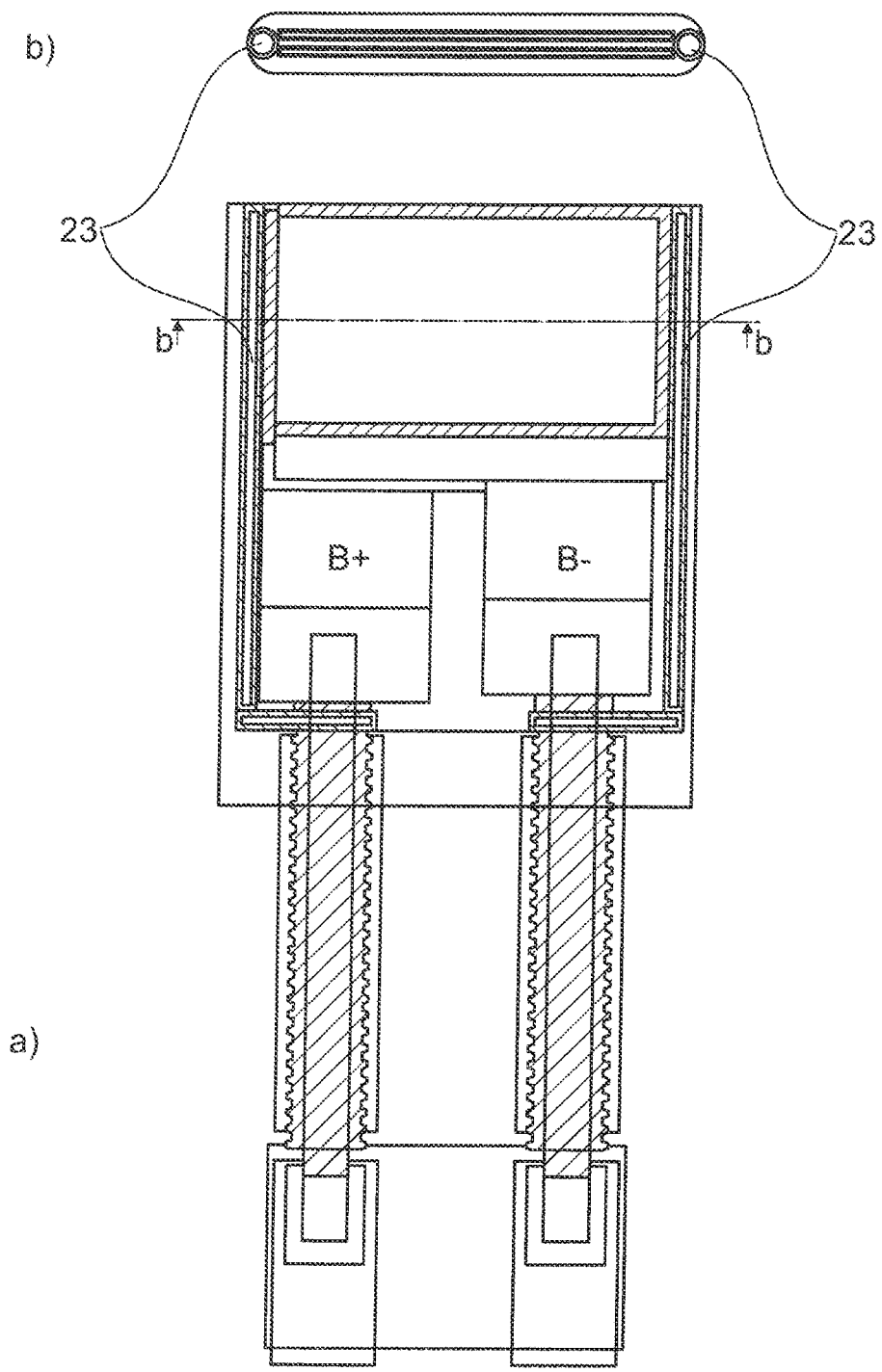
FIG. 5 schematically shows a section of an exemplary line according to a second aspect at a first end, wherein section a) shows a schematic top view onto one end of the line, and section b) shows a cross-section along the line b-b in section a).

FIGS. 1 and 2 show that the field effect of a double bus bar (as shown in FIGS. 4 and 5) in the frequency range of the quasi-stationary magnetic fields of 0 Hz to 200 kHz is approximately 20 to 40 dB lower than in the case of two circular conductors that are spaced from each other.

The greater field effect of circular conductors has many negative drawbacks. For example, the alternating magnetic fields of the circular conductors generate an equalizing current in the shield of the circular conductors, which can be so high that the shield connection becomes thermally overloaded. Furthermore, the alternating magnetic fields generate considerable eddy current losses in the auto body sheet and result in disturbance injections into other cables and systems. Finally, the alternating magnetic fields of the circular conductors cause problems with final vehicle inspection with respect to national requirements, in particular the International Commission on Non-ionizing Radiation Protection (ICNIRP) requirements and those of the Chinese authorities.

Embodiments of the present disclosure provide a double bus bar with a lower field effect than the circular conductors of the prior art. The double bus bar can also be used in the interior of a vehicle, whereby a mechanical protection of the bus bar is not needed.

Figure 3:
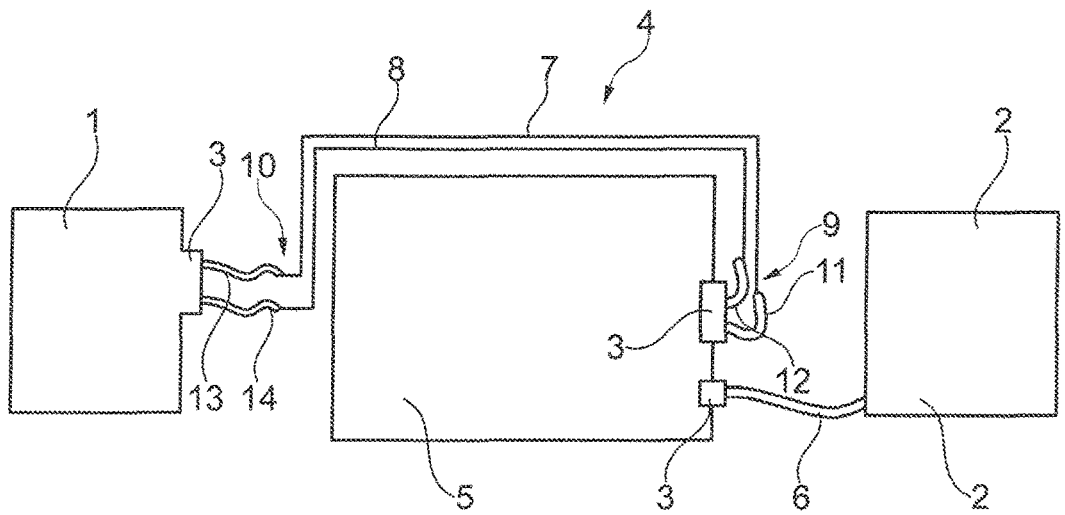
FIG. 3 shows an exemplary arrangement of a line in an electric vehicle.

FIG. 3 schematically shows an application for a line according to an embodiment. The application relates to an electric vehicle comprising an electric drive at the front axle and an electric drive at the rear axle. For this purpose, a power electronics system 1 for the front electric drive and a power electronics system 2 for the rear electric drive are provided. In addition, an HV battery 5 is provided. The HV battery 5 is connected via a conventional flexible line 6 to the power electronics system 2, wherein the flexible line 6 is connected via plugs (not shown) disposed at the two ends of the line 6, in each case to terminals 3 provided on the HV battery 5 and the power electronics system 2. In contrast, the power electronics system 1 is connected via a line 4 according to the present disclosure to the HV battery 5. Due to the composition of the HV battery 5, the power output of the battery, i.e. the terminal for the line 4 and the line 6, can only be provided on one side. Moreover, the HV battery is generally disposed in the rear of the vehicle. As a result, a relatively long line 4 must be provided.

The line 4 comprises two insulated aluminum bus bars 7, 8, for example having a cross-section of 60 mm×1 mm. At opposite ends 9, 10, a first and a second flexible conductor 11 and 12, and a third and a fourth flexible conductor 13 and 14 are appropriately connected to the bus bars 7, 8. The connection will be described in more detail hereafter with reference to FIGS. 4 and 5. Furthermore, the ends of the flexible conductors 11, 12, 13, 14 located opposite the bus bars 7, 8 each include a plug (not shown) for connecting to the terminals 3 of the power electronics system 1 or of the HV battery 5.

The line 4 according to a first aspect is shown in more detail in FIG. 4. The bus bars 7, 8 are disposed on top of each other in a cross-sectional view (as seen in section b) of FIG. 4). This means that the surface areas resulting from the width by the length are congruent as seen from above (as shown in section a) of FIG. 4), and two of these surface areas face each other and the longitudinal edges of the bus bars 7, 8 are aligned in the cross-sectional view. FIG. 4 also shows the insulation 15 of the bus bars 7, 8. FIG. 4 shows the end 9 of the bus bars from FIG. 3 in more detail. As shown, the bus bars 7, 8 each have a connecting lug 16 at this end. The connecting lugs 16 are formed of a bimetal composed of an aluminum section 17 and a copper section 18, which are integrally joined (here, welded) to each other. The aluminum section 17 is integrally joined (for example, welded) to the bus bars 7, 8. The copper section 18 is likewise integrally joined (for example, welded) in each case to the electrical conductors 11, 12, which are also made of copper here. For this purpose the insulation 15 of the bus bars 7, 8, or an insulation 19 of the conductors 11, 12, is removed at the end to be able to establish the contact.

A plug 20 is connected at the ends of the conductors 11, 12 facing away from the bus bars 7, 8 for connecting to the terminal 3 of the HV battery 5.

The conductors 11, 12 are each surrounded by a shield, as is the case with conventional circular conductors.

Furthermore, the bus bars 7, 8, together with the insulation 15 thereof, are surrounded by a foil shield 22, which extends continuously from the end 9 to the end 10 and surrounds the conductors. As shown in FIG. 4, the foil shield 22 extends in the longitudinal direction beyond the contact between the conductors 11, 12 and the bus bars 7, 8, and overlaps with the shield 21 of the conductors 11, 12.

In addition, a stranded drain wire 23 is provided between the insulation 15 of the bus bars 7, 8 and the foil shield 22 in the illustration of FIG. 4. The stranded drain wire runs parallel to the bus bars 7, 8 here, and likewise extends from the end 9 to the end 10. The stranded drain wire is in direct contact at the end 9 with the two shields 21 of the conductors 11, 12, as shown in section a) of FIG. 4. In the shown embodiment, the stranded drain wire 23 is a bare non-insulated stranded copper wire, which is in electrical contact with the foil shield 22 over the entire length of the foil shield 22 from the end 9 to the end 10, The end 10 of the line 4 is designed identically to the end 9 and is also connected there to a plug 20 for connecting to the terminal 3 of the power electronics system 1. The stranded drain wire 23 thus brings about a connection between the shields 21 at the end 9 and the foil shield 22 as well as the shields 21 at the end 10.

Should the equalizing currents be too high due to ground offset and thus pose a risk of damage to the foil shield 22, it may be necessary to provide multiple stranded drain wires 23. For example, FIG. 5 shows two stranded drain wires 23. In this embodiment, the stranded drain wires 23 are each connected to the shield 21 of the first conductor 11 or to the shield 21 of the second conductor 12 at the end 9, or to the shield 21 of the third conductor 13 as well as to the shield 21 of the fourth conductor 14 at the end 10. Otherwise, the embodiment in FIG. 5 does not differ from the embodiment in FIG. 4.

While the present disclosure is illustrated and described in detail according to the above embodiments, the present disclosure is not limited to these embodiments and additional embodiments may be implemented. Further, other embodiments and various modifications will be apparent to those skilled in the art from consideration of the specification and practice of one or more embodiments disclosed herein, without departing from the scope of the present disclosure.

The invention claimed is:

1. A line for supplying power to electrical units in a vehicle, comprising:
at least two electrically conducting, oblong bus bars, extending parallel to each other, the bus bars having a flat cross-section and two opposite ends in the longitudinal direction, wherein the bus bars are respectively insulated from each other;
a foil shield surrounding the bus bars from a first of the opposite ends to a second of the opposite ends;
a first stranded drain wire running between the bus bars and the foil shield in the longitudinal direction from the first of the opposite ends to the second of the opposite ends, wherein the first stranded drain wire is in electrical contact with the foil shield and is configured to carry ground offset equalizing currents;
a pair of flexible electrical conductors at the first of the opposite ends of the bus bars, wherein each flexible electrical conductor includes a first end and a second end, the first conductor end being electrically connected to a respective one of the bus bars; and
a shield surrounding each flexible electrical conductor, wherein each shield is electrically connected to the first stranded drain wire.

2. The line according to claim 1, wherein the line supplies power of more than 3 kW to the electrical units.

3. The line according to claim 1, wherein the line supplies power of more than 12 kW to the electrical units.

4. The line according to claim 1, wherein the foil shield extends in the longitudinal direction beyond the first and second ends of the flexible electrical conductors connected to the bus bars, and wherein the foil shield overlaps in the longitudinal direction with the shield of the conductors.

5. The line according to claim 1, further comprising a second pair of flexible electrical conductors at the second of the opposite ends of the bus bars.

6. The line according to claim 1, wherein each flexible electrical conductor is a circular cross-sectioned electrical conductor.

7. The line according to claim 1, wherein the second ends of the pair of flexible electrical conductors are electrically connected to a plug.

8. The line according to claim 1, wherein the first stranded drain wire is in contact with each shield of the flexible electrical conductors.

9. The line according to claim 1, further comprising a second stranded drain wire, wherein the first stranded drain wire is in contact with a first of the shields surrounding the flexible electrical conductors, and the second stranded drain wire is in contact with a second of the shields surrounding the flexible electrical conductors.

10. A system for supplying power to electrical units in a vehicle, comprising:
a power electronics system;
a high voltage battery;
and a line connecting the power electronics system to the battery, wherein the line further includes:
at least two electrically conducting, oblong bus bars, extending parallel to each other, the bus bars having a flat cross-section and two opposite ends in the longitudinal direction, wherein the bus bars are respectively insulated from each other;
a foil shield surrounding the bus bars from a first of the opposite ends to a second of the opposite ends;
a first stranded drain wire running between the bus bars and the foil shield in the longitudinal direction from the first of the opposite ends to the second of the opposite ends, wherein the first stranded drain wire is in electrical contact with the foil shield and configured to carry ground offset equalizing currents;
a pair of flexible electrical conductors at the first of the opposite ends of the bus bars, wherein each flexible electrical conductor includes a first end and a second end, wherein the first conductor end is electrically connected to a respective one of the bus bars; and
a shield surrounding each flexible electrical conductor, wherein each shield is electrically connected to the first stranded drain wire.

11. The system according to claim 10, wherein the vehicle includes an electric drive connected to the power electronics system.

12. The system according to claim 10, wherein the line supplies power of more than 3 kW to the electrical units.

13. The system according to claim 10, wherein the line supplies power o more than 12 kW to the electrical units.

14. The system according to claim 10, wherein the foil shield extends in the longitudinal direction beyond the first and second ends of the flexible electrical conductors connected to the bus bars, and wherein the foil shield overlaps in the longitudinal direction with the shield of the conductors.

15. The system according to claim 10, further comprising a second pair of flexible electrical conductors at the second of the opposite ends of the bus bars.

16. The system according to claim 10, wherein each flexible electrical conductor is a circular cross-sectioned electrical conductor.

17. The system according to claim 10, wherein the second ends of he pair of flexible electrical conductors are electrically connected to a plug.

18. The system according to claim 10, wherein the first stranded drain wire is in contact with each shield of the flexible electrical conductors.

19. The system according to claim 10, further comprising a second stranded drain wire, wherein the first stranded drain wire is in contact with a first of the shields surrounding the flexible electrical conductors, and the second stranded drain wire is in contact with a second of the shields surrounding the flexible electrical conductors.

* * * * *